(12) United States Patent
Lee

(10) Patent No.: US 7,952,405 B2
(45) Date of Patent: May 31, 2011

(54) SEMICONDUCTOR DEVICE

(75) Inventor: Seong-Jun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/493,712

(22) Filed: Jun. 29, 2009

(65) Prior Publication Data

US 2010/0109727 A1 May 6, 2010

(30) Foreign Application Priority Data

Oct. 31, 2008 (KR) .................. 10-2008-0108050

(51) Int. Cl.
*H03L 7/06* (2006.01)

(52) U.S. Cl. .................. 327/158; 327/149

(58) Field of Classification Search .................. 327/149, 327/158
See application file for complete search history.

(56) References Cited

U.S. PATENT DOCUMENTS

| | | | | |
|---|---|---|---|---|
| 6,100,733 A * | 8/2000 | Dortu et al. | ............ | 327/149 |
| 6,288,585 B1 * | 9/2001 | Bando et al. | ............ | 327/156 |
| 6,445,231 B1 * | 9/2002 | Baker et al. | ............ | 327/158 |
| 6,570,456 B2 * | 5/2003 | Mano et al. | ............ | 331/11 |
| 6,600,352 B2 * | 7/2003 | Miyamoto | ............ | 327/161 |
| 6,882,580 B2 | 4/2005 | Lim et al. | | |
| 7,020,794 B2 * | 3/2006 | Lin | ............ | 713/401 |
| 7,053,666 B2 | 5/2006 | Tak et al. | | |
| 7,292,080 B2 * | 11/2007 | Minzoni | ............ | 327/158 |
| 7,358,784 B2 * | 4/2008 | Kim et al. | ............ | 327/158 |
| 7,492,200 B2 * | 2/2009 | Na | ............ | 327/158 |
| 7,501,867 B2 | 3/2009 | Poulton et al. | | |
| 2005/0093594 A1 * | 5/2005 | Kim et al. | ............ | 327/158 |
| 2007/0046344 A1 * | 3/2007 | Minzoni | ............ | 327/158 |
| 2007/0069781 A1 * | 3/2007 | Kim et al. | ............ | 327/158 |
| 2007/0206428 A1 | 9/2007 | Bae et al. | | |
| 2008/0042704 A1 * | 2/2008 | Na | ............ | 327/158 |
| 2008/0042705 A1 * | 2/2008 | Kim et al. | ............ | 327/158 |
| 2008/0157836 A1 * | 7/2008 | Cho | ............ | 327/158 |
| 2009/0146706 A1 * | 6/2009 | You | ............ | 327/158 |
| 2010/0109727 A1 * | 5/2010 | Lee | ............ | 327/158 |

FOREIGN PATENT DOCUMENTS

| | | |
|---|---|---|
| JP | 2000-100163 | 4/2000 |
| KR | 1020080039076 A | 5/2008 |
| KR | 1020080061962 A | 7/2008 |

OTHER PUBLICATIONS

Notice of Preliminary Rejection issued from Korean Intellectual Property Office on Feb. 11, 2010.

* cited by examiner

*Primary Examiner* — Lincoln Donovan
*Assistant Examiner* — Adam D Houston
(74) *Attorney, Agent, or Firm* — IP & T Group LLP

(57) ABSTRACT

A semiconductor device for providing a reliable data valid window includes a drive control unit configured to output a driving power control signal in response to an internal clock and a command signal; a sub-drive voltage supply unit configured to supply sub-drive voltages; a main drive unit configured to generate a delay-locked loop (DLL) clock by driving the internal clock with a main drive voltage; a sub-drive unit configured to drive the internal clock with the sub-drive voltage in response to the driving power control signal; and a data output driver configured to drive and output a data signal in sync with the DLL clock, wherein the main drive unit and the sub-drive unit share their output terminal.

25 Claims, 4 Drawing Sheets

SEMICONDUCTOR DEVICE

CROSS-REFERENCE TO RELATED APPLICATION

The present invention claims priority of Korean patent application number 10-2008-0108050, filed on Oct. 31, 2008, which is incorporated by reference in its entirety.

BACKGROUND OF THE INVENTION

The present invention relates to a semiconductor device, and more particularly, to a semiconductor device providing a reliable data valid window.

A semiconductor memory device generates an internal voltage having a stable voltage level by using an external voltage supplied from an external circuit in order to perform a reliable operation. However, the voltage levels of the internal voltage and the external voltage are easily decreased in a practical read operation of the semiconductor device because of the abrupt current consumption. Due to the abovementioned decrease of the internal voltage, a read operation error can be induced.

In detail, several internal circuits, e.g., a sense amplifier, a pre-driver, and an output driver, which are located in a read path of the semiconductor device, are operated sequentially in response to a read command. In the operation of the internal circuits, the current consumption is abruptly increased. Particularly, an amount of the current is consumed during a period of an initial data output, and therefore, the voltage is decreased mostly in this period. As a result, an initial data valid window becomes relatively narrow because of the abrupt current consumption and the semiconductor device fails to perform an initial read operation correctly.

SUMMARY OF THE INVENTION

Embodiments of the present invention are directed to a semiconductor device, and more particularly, to a semiconductor device providing a reliable data valid window.

In accordance with an aspect of the present invention, there is provided a semiconductor device including a delay-locked loop (DLL) clock generation unit configured to generate an internal clock by delaying and locking an external clock and to output a DLL clock by driving the internal clock; and a data output drive unit configured to output a data signal in sync with the DLL clock, wherein a driving power configured to drive the internal clock is controlled in sync with the internal clock. The DLL clock generation unit controls the driving power in sync with a period of the internal clock corresponding to a data output period.

In accordance with another aspect of the present invention, there is provided a semiconductor device including a delay-locked loop (DLL) unit configured to generate an internal clock by delaying and locking an external clock; a drive control unit configured to generate a drive power control signal in response to a command signal and the internal clock; and a DLL drive unit configured to output a DLL clock controlling a data output time by driving the internal clock, wherein a driving power of the DLL drive unit is configured to be controlled by the drive power control signal.

In accordance with still another aspect of the present invention, there is provided a semiconductor device including a drive control unit configured to output a driving power control signal in response to an internal clock and a command signal; a sub-drive voltage supply unit configured to supply sub-drive voltages; a main drive unit configured to generate a delay-locked loop (DLL) clock by driving the internal clock with a main drive voltage; a sub-drive unit configured to drive the internal clock with the sub-drive voltage in response to the driving power control signal; and a data output driver configured to drive and output a data signal in sync with the DLL clock, wherein the main drive unit and the sub-drive unit share their output terminal.

DESCRIPTION OF SPECIFIC EMBODIMENTS

Other objects and advantages of the present invention can be understood by the following description, and become apparent with reference to the embodiments of the present invention.

Hereinafter, a semiconductor device securing a reliable data process in accordance with an embodiment of the present invention will be described in detail.

Figure 1:
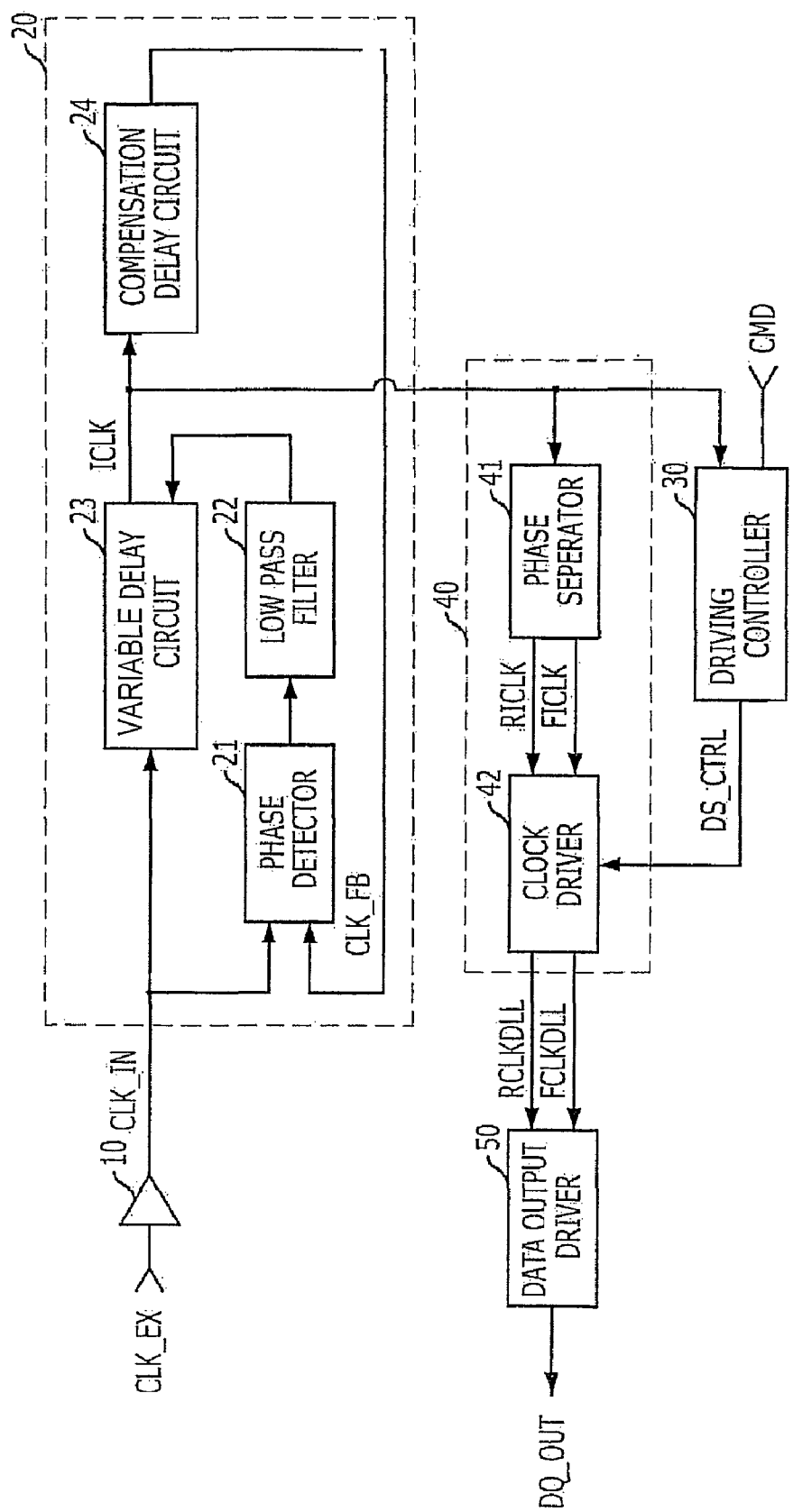
FIG. 1 is a block diagram illustrating a semiconductor device in accordance with an embodiment of the present invention.

FIG. 1 is a block diagram illustrating a semiconductor device in accordance with an embodiment of the present invention.

Referring to FIG. 1, the semiconductor device includes a clock buffer 10, a delay-locked loop (DLL) circuit 20, a driving controller 30, a DLL driver 40, and a data output driver 50. The clock buffer 10 generates an input clock CLK_IN by buffering an external clock CLK_EX. The DLL circuit 20 generates an internal clock ICLK by delaying and locking the input clock CLK_IN. The driving controller 30 generates a driving power control signal DS_CTRL by using a command signal CMD and the internal clock ICLK. An active duration of the driving power control signal DS_CTRL includes a data output time. The command signal CMD can be a signal related to a data output operation. Specifically, it is preferable that the command signal CMD shown in FIG. 1 is a read command signal. The DLL driver 40 outputs a rising DLL clock RCLKDLL and a falling DLL clock FCLKDLL by driving the internal clock ICLK. The DLL driver 40 is controlled by the driving power control signal DS_CTRL. That is, a driving power of the DLL driver 40 increases when the driving power control signal DS_CTRL is enabled and, therefore, the slopes of the rising DLL clock RCLKDLL and a falling DLL clock FCLKDLL becomes steep. The DLL driver 40 includes a phase separator 41 and a clock driver 42. The phase separator 41 generates an internal rising clock RICLK and an internal falling clock FICLK from the internal clock ICLK. The internal rising clock RICLK has the same phase with the internal clock ICLK and the internal falling clock FICLK has the opposite phase with the internal clock ICLK. The clock driver 42 outputs the rising DLL clock RCLKDLL and a falling DLL clock FCLKDLL by respectively driving the internal rising clock RICLK and the internal falling clock FICLK. The driving power of the clock driver 42 is controlled by the driving power control signal DS_CTRL. Further, the data output driver 50 outputs an output data signal DQ_OUT by driving an input data signal DQ_IN in sync with the rising DLL clock RCLKDLL and the falling DLL clock FCLKDLL.

The DLL circuit 20 includes a phase detector 21, a low pass filter 22, a variable delay circuit 23, and a compensation delay circuit 24. The phase detector 21 compares phases of the input clock CLK_IN and a feed-back clock CLK_FB and detects an phase error based on the input clock CLK_IN and the feed-back clock CLK_FB. The low pass filter 22 generates a control signal for controlling a delay time of the variable delay circuit 23 in response to the phase error detected by the phase detector 22. The variable delay circuit 23 delays the input clock CLK_IN in response to the control signal and generates the internal clock ICLK. The compensation delay circuit 24 delays the internal clock ICLK as much as a data output delay and generates the feed-back clock CLK_FB. Herein, the data output delay corresponds to a time from a moment that a data is outputted from a memory cell array to a moment that the data is outputted to outside of the memory chip through the data output driver 50.

Figure 2:
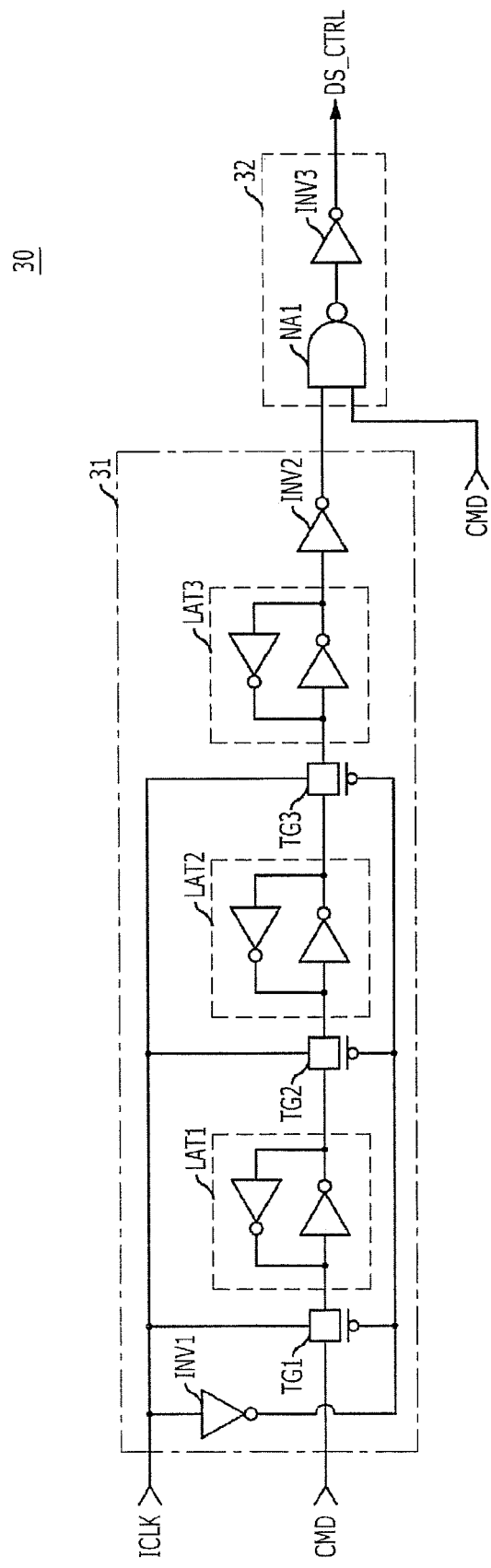
FIG. 2 is a detailed circuit diagram of the driving controller shown in FIG. 1.

FIG. 2 is a detailed circuit diagram of the driving controller shown in FIG. 1.

The driving controller 30 includes a latch unit 31 and a combining unit 32. The latch unit 31 latches the command signal CMD in response to the internal clock ICLK. The combining unit 32 generates the driving power control signal DS_CTRL by combining the command signal CMD and an output of the latch unit 31.

The latch unit 31 is configured with a plurality of inverters, transmission gates, and latches. A first inverter INV1 inverts a phase of the internal clock ICLK. A first transmission gate TG1 transmits the command signal CMD in response to the internal clock ICLK and an output of the first inverter INV1. A first latch LAT1 latches an output of the first transmission gate TG1. A second transmission gate TG2 transmits an output of the first latch LAT1 in response to the internal clock ICLK and an output of the first inverter INV1. A second latch LAT2 latches an output of the second transmission gate TG2. A third transmission gate TG3 transmits an output of the second latch LAT2 in response to the internal clock ICLK and an output of the first inverter INV1. A third latch LAT latches an output of the third transmission gate TG3. A second inverter INV2 inverts an output of the third latch LAT3.

The combining unit 32 is configured with a NAND gate NA1 and a third inverter INV3. The NAND gate logically combines the command signal CMD and an output of the second inverter INV2. The third inverter INV3 outputs the driving power control signal DS_CTRL by inverting a phase of an output of the NAND gate NA1.

The driving controller 30 with the above-mentioned structure latches the command signal CMD by being sequentially synchronized with falling and rising edges of the internal clock ICLK in order to generate a latched signal and outputs the driving power control signal DS_CTRL by logically combining the command signal CMD and the latched signal. Herein, an active duration of the driving power control signal DS_CTRL is controlled to be one period of the internal clock ICLK which firstly appears after input of the command signal CMD.

Although not depicted in the drawings, the driving controller 30 can be implemented in another structure. For example, the driving controller includes a command signal delay for generating a delay signal by delaying the command signal CMD in response to the internal clock CLK and a combining unit for generating the driving power control signal DS_CTRL by combining the delay signal and the command signal CMD.

The command signal delay is designed to delay the command signal CMD to a predetermined edge of the internal clock ICLK in order to generate a delay signal. The combining unit is implemented to combine the delay signal and the command signal CMD to generate driving power control signal DS_CTRL. Herein, the command signal delay delays the command signal CMD for one period of the internal clock ICLK and the combining unit outputs the driving power control signal DS_CTRL whose active duration corresponds to one period of the internal clock ICLK which appears in an initial data output period.

The command signal delay can be configured with a plurality delay elements, e.g., an inverter chain, and the combining unit can be configured with logic elements. The detailed explanation about the structure of the command signal delay and the combining unit is omitted because it is possible to be easily implemented by those skilled in the art.

Further, the driving controller 30 can be constituted with a control signal counter and a combining unit. The control signal counter counts the command signal CMD by using the internal clock ICLK. The combining unit generates the driving power control signal DS_CTRL by combining an output of the command signal counter and the command signal CMD. In detail, the control signal counter counts the command signal CMD during one period of the internal clock ICLK which is firstly appears after input of the command signal CMD. The combining unit combines the output of the command signal counter and the command signal CMD and generates driving power control signal DS_CTRL whose active duration is one period of the internal clock ICLK.

The command signal counter can be configured with a plurality of flip-flops, e.g., a D type flip-flop, and the combining unit can be configured with logic elements. The detailed explanation about the structure of the command signal counter and the combining unit is omitted because it can be easily implemented by those skilled in the art.

Figure 3:
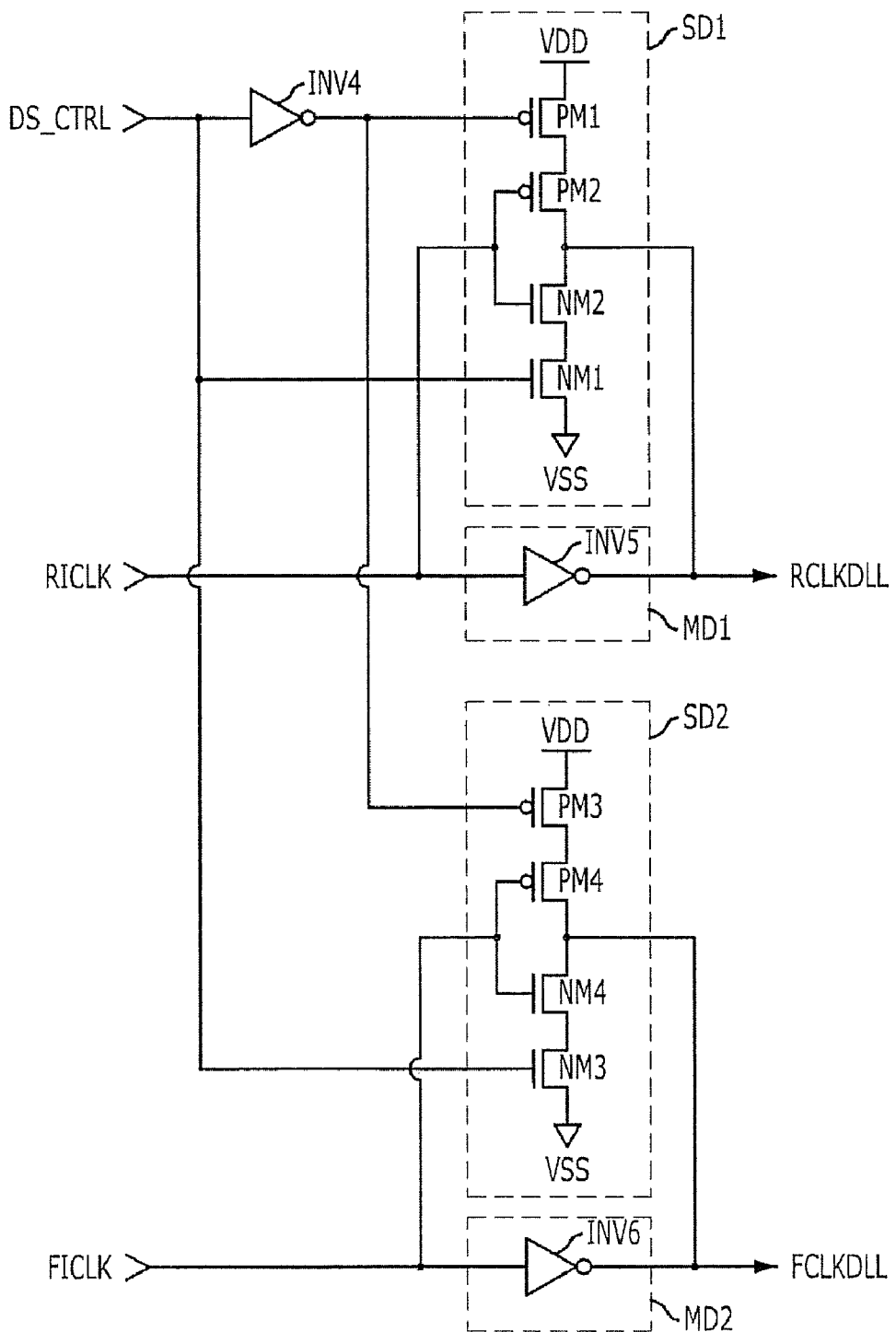
FIG. 3 is a detailed circuit diagram of the clock driver in accordance with an embodiment of the present invention.

FIG. 3 is a detailed circuit diagram of the clock driver in an embodiment of the present invention of the present invention.

Referring to FIG. 3, the clock driver 42 includes an inverter INV4, two main drivers MD1 and MD2, and two sub-drivers SD1 and SD2. The fourth inverter INV4 inverts the driving power control signal DS_CTRL. The first main driver MD1 generates the rising DLL clock RCLKDLL by performing a pull-up/down driving operation in response to the internal rising clock RICLK. The first sub-driver SD1 adjusts the slope of the rising DLL clock RCLKDLL by performing a pull-up/down driving operation in response to the internal rising clock RICLK and the driving power control signal DS_CTRL. The second main driver MD2 generates the falling DLL clock FCLKDLL by performing a pull-up/down driving operation in response to the internal falling clock FICLK. The second sub-driver SD2 adjusts the slope of the falling DLL clock FCLKDLL by performing a pull-up/down driving operation in response to the internal falling clock FICLK and the driving power control signal DS_CTRL. Herein, it is possible to include a plurality of the first and the second sub-drivers SD1 and SD2 in the clock driver 42.

The first main driver MD1 is implemented with a fifth inverter INV5 inverting the internal rising clock RICLK in order to generate the rising DLL clock RCLKDLL.

The first sub-driver SD1 is implemented with two PMOS transistors PM1 and PM2 and two NMOS transistors NM1 and NM2. The first PMOS transistor PM1, whose first terminal is connected a power supply voltage VDD terminal, receives an output of the fourth inverter INV4 through its gate. The first NMOS transistor NM1, whose first terminal is connected to a ground voltage VSS terminal, receives the driving power control signal DS_CTRL through its gate. The second PMOS transistor PM2 is connected between the first PMOS transistor PM1 and an output terminal of the first main driver MD1 and receives the internal rising clock RICLK through its gate. The second NMOS transistor NM2 is connected between the output terminal of the first main driver MD1 and the first NMOS transistor NM1 receives the internal rising clock RICLK through its gate.

The second main driver MD2 is implemented with a sixth inverter INV6 inverting the internal falling clock FICLK in order to generate the falling DLL clock FCLKDLL.

The second sub-driver SD2 is implemented with two PMOS transistors PM3 and PM4 and two NMOS transistors NM3 and NM4. The third PMOS transistor PM3, whose first terminal is connected the power supply voltage VDD terminal, receives the output of the fourth inverter INV4 through its gate. The third NMOS transistor NM3, whose first terminal is connected to the ground voltage VSS terminal, receives the driving power control signal DS_CTRL through its gate. The fourth PMOS transistor PM4 is connected between the first PMOS transistor PM3 and an output terminal of the second main driver MD2 and receives the internal falling clock FICLK through its gate. The fourth NMOS transistor NM4 is connected between the output terminal of the second main driver MD2 and the third NMOS transistor NM3 receives the internal falling clock FICLK through its gate.

The clock driver 42 with abovementioned structure drives the internal rising clock RICLK and the internal falling clock FICLK and outputs the rising DLL clock RCLKDLL and the falling DLL clock FCLKDLL, respectively. The driving power of the clock driver 42 increases while the driving power control signal DS_CTRL is enabled as a logic high level.

In other embodiment of the present invention, the clock driver 42 controls its driving power by adjusting a voltage level of a driving voltage inputted to the clock driver 42.

Figure 4:
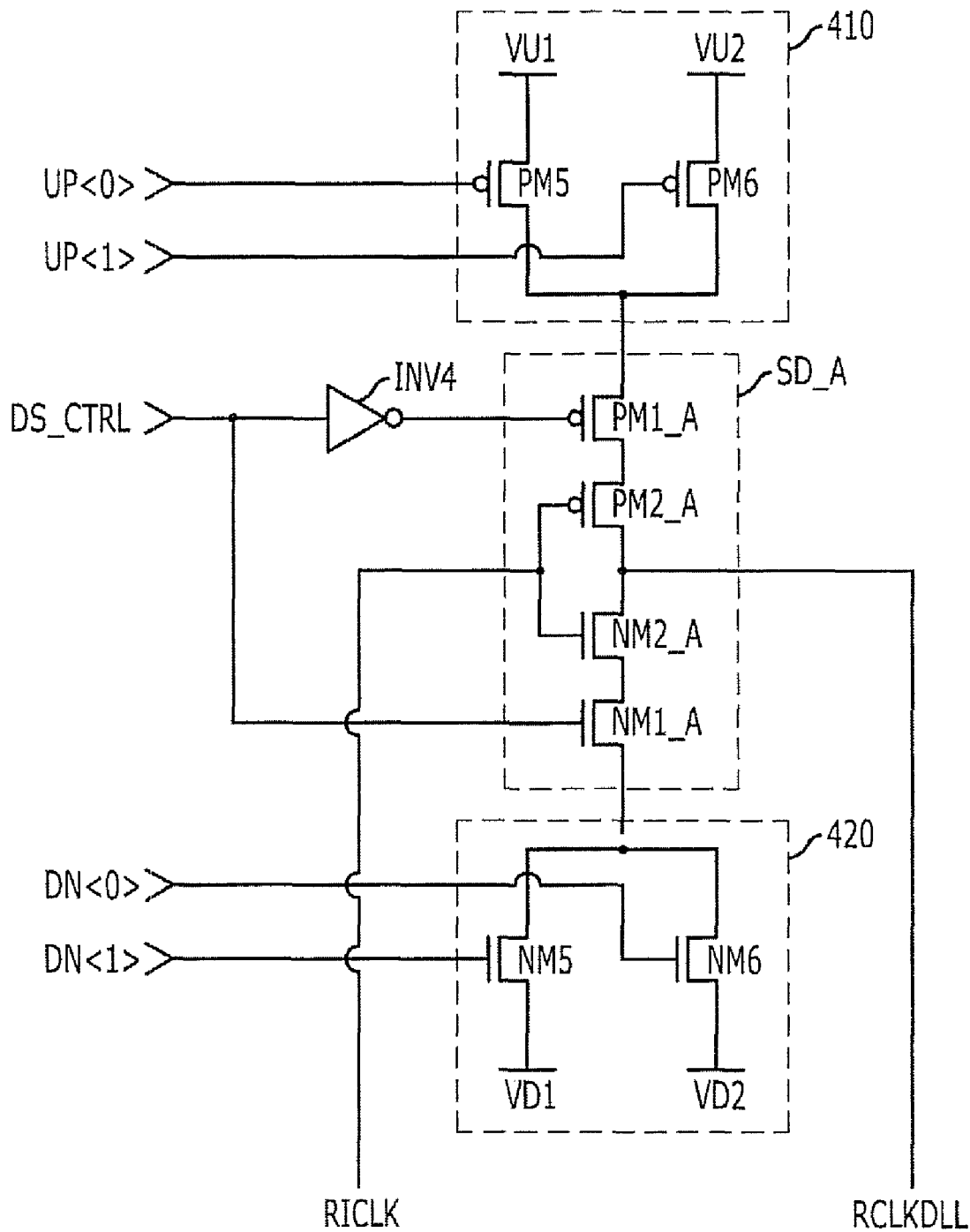
FIG. 4 is a detailed circuit diagram of the clock driver in accordance with another embodiment of the present invention.

FIG. 4 is a detailed circuit diagram of the clock driver in accordance with another embodiment of the present invention.

Herein, the clock driver 42A in accordance with another embodiment of the present invention includes an inverter INV4_A, a sub-driver SD_A, a pull-up drive voltage supply unit 410, and a pull-down drive voltage supply unit 420.

The sub-driver SD_A has the similar structure with the sub-drivers SD1 and SD2 shown in FIG. 3. That is, the sub-driver SD_A is implemented with two PMOS transistors PM1_A and PM2_A and two NMOS transistors NM1_A and NM2_A. The first PMOS transistor PM1_A whose first terminal is connected the power supply voltage VDD terminal, receives an output of the inverter INV4 through its gate. The first NMOS transistor NM1_A, whose first terminal is connected to the ground voltage VSS terminal, receives the driving power control signal DS_CTRL through its gate. The second PMOS transistor PM2_A is connected between the first PMOS transistor PM1_A and an output terminal and receives the internal rising clock RICLK through its gate. The second NMOS transistor NM2_A is connected between the output terminal and the first NMOS transistor NM1_A and receives the internal rising clock RICLK through its gate.

The pull-up drive voltage supply unit 410 includes two PMOS transistors PM5 and PM6 respectively coupled to pull-up drive voltages VU1 and VU2 and supplying the pull-up drive voltages VU1 and VU2 to the sub-driver SD_A in response to up signals UP<0:1>. The up signals UP<0:1>, enabled inside the interval that the driving power control signal DS_CTRL is enabled, are supplied from an external circuit or generated according to a mode register set of the semiconductor device.

In one embodiment of the present invention, the first pull-up drive voltage VU1 is a power supply voltage VDD and the second pull-up drive voltage VU2 is a voltage, e.g., a pumping voltage VPP, having a higher voltage level than the power supply voltage VDD. In this case, the second pull-up drive voltage VU2 and the first pull-up drive voltage VU1 are sequentially provided to the first PMOS transistor PM1_A in response to the second up signal UP<1> and the first up signal UP<0>, respectively.

In another embodiment of the present invention, the pull-up drive voltages VU1 and VU2 have the same voltage level of the power supply voltage VDD. In this case, the sizes of the PMOS transistors PM5 and PM6 are different each other so that the level of, for example, the voltages supplied to the first PMOS transistor PM1_A in response to the up signals UP<0:1> have different levels.

Meanwhile, the pull-up drive voltage supply unit 410 can include fuses connected between the PMOS transistor PM5 and the first PMOS transistor PM1_A and the PMOS transistor PM6 and the first PMOS transistor PM1_A, respectively. In this case, the gates of the PMOS transistor PM5 and PM6 are connected to the ground voltage VSS terminal instead of the up signals UP<0:1>.

The pull-down drive voltage supply unit 420 includes two NMOS transistor NM5 and NM6 respectively generating pull-down drive voltages VD1 and VD2 and supplying the pull-down drive voltages VD1 and VD2 to the pull-down drive voltages VD1 and VD2 to the sub-driver SD_A in response to down signals DN<0:1>. The down signals DN<0:1>, enabled during the interval that the driving power control signal DS_CTRL is enabled, are supplied from an external circuit or generated according to a mode register set of the semiconductor device.

In one embodiment of the present invention, the first pull-down drive voltage VD1 is a ground voltage VSS and the second pull-down drive voltage VD2 is a voltage, e.g., a back bias voltage VBB, having a lower voltage level than the ground voltage VSS. In this case, the second pull-down drive voltage VD2 and the first pull-down drive voltage VD1 are sequentially provided to the first NMOS transistor NM1_A in response to the second down signal DN<1> and the first down signal DN<0>, respectively.

In another embodiment of the present invention, the pull-down drive voltages VD1 and VD2 have the same voltage level of the ground voltage VSS. In this case, the sizes of the NMOS transistors NM5 and NM6 are different from each other so that the level of, for example, the voltages supplied to the first NMOS transistor NM1_A in response to the down signals DN<0:1> have different levels.

Meanwhile, the pull-down drive voltage supply unit 420 can include fuses connected between the NMOS transistor NM5 and the first NMOS transistor NM1_A and the NMOS transistor NM6 and the first NMOS transistor NM1_A, respectively. In this case, the gates of the NMOS transistor NM5 and NM6 are connected to the power supply voltage VDD terminal instead of the down signals DN<0:1>.

As described above, embodiments of the present invention relate to the semiconductor device generating the internal clock ICLK by delaying and locking the external clock CLK_EX, separating the internal clock to generate the internal rising and falling clocks RICLK and FICLK, and outputting the rising and failing DLL clocks RCLKDLL and FCLKDLL by driving the internal rising and falling clocks RICLK and FICLK for the read operation.

Generally, the internal circuits, e.g., a sense amplifier, a pre-driver, an output driver, and the delay-locked loop (DLL) circuit, are sequentially operated for a data output operation.

For the operation of the internal circuits, the current consumption is abruptly increased. When the consumption of the internal and external voltage is increased, the level of the voltage provided into the clock driver 42 is decreased and, therefore, the driving power of the clock driver 42 is also reduced. As a result, the slopes of the rising and the falling DLL clocks RCLKDLL and FCLKDLL becomes dull and the data valid window becomes narrow.

However, the present invention prevents the clock driver 42 from outputting the rising and falling DLL clocks RCLKDLL and FCLKDLL with a dull slope by adjusting the driving power of the clock driver 42 in response to the driving power control signal DS_CTRL outputted in the driving controller 30. Especially, an active duration of the driving power control signal DS_CTRL is controlled to be a period of the internal clock ICLK that first appears after input of the CMD. Consequently, the semiconductor device of the present invention is possible to control the driving power of the clock driver 42 in the initial data output period where an amount of current consumption occurs.

Herein, the active duration of the driving power control signal DS_CTRL is not limited to only one period of the internal clock ICLK. It is also possible to control the driving power of the clock driver 42 in any data output period as well as the initial data output period by adjusting the active duration of the driving power control signal DS_CTRL by synchronizing with the initial clock ICLK. Further, the driving power control signal DS_CTRL is only enabled for a predetermined period of the internal clock ICLK and disabled in another period of the internal clock ICLK, therefore, the semiconductor device of the present invention reduces unnecessary current consumption of the clock driver 42.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a delay-locked loop (DLL) unit configured to generate an internal clock by delaying an external clock and locking the internal clock;
    a drive control unit configured to generate a driving power control signal in response to a command signal and the internal clock;
    a DLL drive unit configured to output a DLL clock for controlling a data output time by driving the internal clock in response to the driving power control signal; and
    a data output drive unit configured to receive the DLL clock and data input and output a data signal in sync with the DLL clock,
    wherein the driving power control signal controls a driving power of the DLL drive unit.

2. The semiconductor device as recited in claim 1, wherein the drive control unit is configured to be enabled in response to the command signal and output the driving power control signal whose active duration corresponds to a period of the internal clock.

3. The semiconductor device as recited in claim 2, wherein the driving power control signal has the active duration corresponding to a data output period synchronized with the command signal.

4. The semiconductor device as recited in claim 3, wherein the driving power control signal corresponds to a period of the internal clock that first appears after input of the command signal.

5. The semiconductor device as recited in claim 1, wherein the drive control unit includes:
    a latch unit configured to latch the command signal in sync with edges of the internal clocks; and
    a combining unit configured to output the driving power control signal by logically combining an output signal of the latch unit and the command signal.

6. The semiconductor device as recited in claim 1, wherein the drive control unit includes:
    a delay unit configured to delay the command signal for a predetermined time in response to edges of the internal clock; and
    a combining unit configured to output the driving power control signal by logically combining an output of the delay unit and the command signal.

7. The semiconductor device as recited in claim 1, wherein the drive control unit includes:
    a counter configured to count the command signal in sync with edges of the internal clock; and
    a combining unit configured to output the driving power control signal by logically combining an output of the counter and the command signal.

8. The semiconductor device as recited in claim 1, wherein the DLL drive unit includes:
    a main driver configured to drive the internal clock; and
    a sub-driver configured to drive the internal clock in response to the driving power control signal,
    wherein the main driver and the sub-driver share their output terminal.

9. The semiconductor device as recited in claim 8, wherein the main driver and the sub-driver are configured to perform a pull-up driving operation.

10. The semiconductor device as recited in claim 8, wherein the main driver and the sub-driver are configured to perform a pull-down driving operation.

11. The semiconductor device as recited in claim 8, wherein the DLL drive unit further includes a phase separator configured to separate a phase of the internal clock and output a rising internal clock and a falling internal clock, wherein the rising internal clock has the same phase with the internal clock and the falling internal clock has the opposite phase with the internal clock.

12. The semiconductor device as recited in claim 11, wherein the rising internal clock is inputted to the main driver and the sub-main driver configured to perform a pull-up driving operation and the falling internal clock is inputted to the main driver and the sub-driver configured to perform a pull-down driving operation.

13. The semiconductor memory device as recited in claim 1, wherein the command signal is a read command signal.

14. A semiconductor device, comprising:
    a drive control unit configured to output a driving power control signal in response to an internal clock and a command signal;
    a sub-drive voltage supply unit configured to supply sub-drive voltages;
    a main drive unit configured to generate a delay-locked loop (DLL) clock by driving the internal clock with a main drive voltage;
    a sub-drive unit configured to drive the internal clock with the sub-drive voltage in response to the driving power control signal; and
    a data output driver configured to drive and output a data signal in sync with the DLL clock,
    wherein the main drive unit and the sub-drive unit share their output terminal.

15. The semiconductor device as recited in claim 14, wherein the drive control unit is configured to generate the driving power control signal whose active duration is synchronized with the period of the internal clock when the command is inputted.

16. The semiconductor device as recited in claim 15, wherein the driving power control signal has the active duration corresponding to a data output period synchronized with the command signal.

17. The semiconductor device as recited in claim 14, wherein the sub-drive voltage supply unit sequentially provides the sub-drive unit with the sub-drive voltages having different voltage levels in response to control signals enabled by the driving power control signal.

18. The semiconductor device as recited in claim 17, wherein the sub-drive voltages includes first sub-drive voltages having a higher voltage level than a power supply voltage and second sub-drive voltages having a lower voltage level than a ground voltage.

19. The semiconductor device as recited in claim 14, wherein the sub-drive voltage supply unit is configured to selectively provide the sub-drive unit with the sub-drive voltages having different voltage levels in response to a fuse option.

20. The semiconductor device as recited in claim 14, wherein the sub-drive voltage supply unit includes:
   a plurality of pull-up transistors, each of which is configured to supply a corresponding sub-drive voltage selected from pull-up drive voltages in response to a corresponding up signal; and
   a plurality of pull-down transistors, each of which is configured to supply a corresponding sub-drive voltage selected from pull-down drive voltages in response to a corresponding down signal,
   wherein the up signal and the down signal are enabled in an active duration of the driving power control signal.

21. The semiconductor device as recited in claim 20, wherein the pull-up transistors each have a different size from one another and the pull-up drive voltages have the same voltage level.

22. The semiconductor device as recited in claim 21, wherein the pull-down transistors each have a different size from one another and the pull-down drive voltages have the same voltage level.

23. The semiconductor device as recited in claim 14, wherein the command signal is a read command signal.

24. The semiconductor device as recited in claim 14, wherein the sub-drive unit is configured to selectively turn on or off the driving of the internal clock with the sub-drive voltage in response to first and second logic states of the driving power control signal, respectively, during a time that the internal clock is being driven with the main drive voltage by the main drive unit.

25. The semiconductor device as recited in claim 1, wherein the DLL drive unit is configured to output the DLL clock by pulling up or down a voltage of the DLL clock with a first driving strength in response to a first logical state of the driving power control signal and with a second driving strength in response to a second logical state of the driving power control signal.

* * * * *